United States Patent
Lu et al.

(10) Patent No.: US 7,515,240 B2
(45) Date of Patent: Apr. 7, 2009

(54) FLAT DISPLAY PANEL AND ASSEMBLY PROCESS OR DRIVER COMPONENTS IN FLAT DISPLAY PANEL

(75) Inventors: Chao-Liang Lu, Jhongli (TW); Chih-Hsiang Yang, Yangmei Township, Taoyuan County (TW); Kuo-Chih Lee, Sinhua Township, Tainan County (TW)

(73) Assignee: Au Optronics Corporation (TW)

( * ) Notice: Subject to any disclaimer, the term of this patent is extended or adjusted under 35 U.S.C. 154(b) by 601 days.

(21) Appl. No.: 10/958,719

(22) Filed: Oct. 5, 2004

(65) Prior Publication Data

US 2006/0072060 A1 Apr. 6, 2006

(51) Int. Cl.
G02F 1/1345 (2006.01)

(52) U.S. Cl. .................. 349/151; 349/149; 349/150; 349/152

(58) Field of Classification Search .......... 349/149–152
See application file for complete search history.

(56) References Cited

U.S. PATENT DOCUMENTS

| | | | |
|---|---|---|---|
| 6,031,590 A * | 2/2000 | Kim | 349/86 |
| 6,618,111 B1 | 9/2003 | Nagata et al. | 349/19 |
| 6,624,868 B1 | 9/2003 | Terukina et al. | 349/149 |
| 6,756,975 B1 * | 6/2004 | Kishida et al. | 345/204 |
| 6,972,966 B1 * | 12/2005 | Oishi et al. | 361/803 |
| 7,088,416 B2 * | 8/2006 | Hagiwara | 349/149 |
| 7,187,426 B2 * | 3/2007 | Kaneko et al. | 349/149 |
| 2001/0015709 A1 | 8/2001 | Imago et al. | 345/87 |

FOREIGN PATENT DOCUMENTS

JP 5-107551 4/1993

* cited by examiner

*Primary Examiner*—Julie Ngo
(74) *Attorney, Agent, or Firm*—Baker & McKenzie LLP; David I. Roche

(57) ABSTRACT

A flat display panel comprises a plurality of driver ICs and one or more flexible printed circuit, a plurality of common wires formed on the substrate to electrically connect the ICs to the one or more flexible printed circuit, and at least one anisotropic conductive film that connects respective connecting terminals of the driver ICs and flexible printed circuit to terminals pads of the common wires. The anisotropic conductive film is laminated over the substrate to cover the terminal pads. The driver ICs and flexible printed circuit are aligned and attached on the anisotropic conductive layer by thermocompression bonding.

17 Claims, 4 Drawing Sheets

FLAT DISPLAY PANEL AND ASSEMBLY PROCESS OR DRIVER COMPONENTS IN FLAT DISPLAY PANEL

BACKGROUND OF THE INVENTION

1. Field of the Invention

This invention generally relates to the field of flat display panel manufacture, and more particularly to the interconnection structure and the assembly process of driver components in flat display panels such as liquid crystal display (LCD) panels.

2. Description of the Related Art

The construction of flat display panels such as LCDs generally includes pixel cells arranged in array and driven by means of driver components placed at the peripheral area of the display area. The driver components are conventionally operable to output addressing and data image signals to the pixel cells to control the illumination or extinction for achieving image displaying.

The driver components conventionally include scan driver integrated circuits (ICs) and data driver ICs along two peripheral sides of the display panel. Flexible printed circuits are coupled with the scan and data driver ICs to provide signals such as power, display or ground signals. Many technical approaches are known in the art to assemble the driver components on the LCD panel.

U.S. Pat. No. 6,618,111 issued to Nagata et al., the disclosure of which is incorporated herein by reference, describes a liquid crystal panel in which the driver ICs are embedded on tape carrier packages distributed along the periphery of the display panel. The driver ICs electrically connect via the wiring of the tape carrier packages to wires that couple the driver ICs to a circuit substrate located at a corner of the display panel.

U.S. Pat. No. 6,624,868 issued to Terukina et al., the disclosure of which is also incorporated herein by reference, describes a LCD panel structure in which the driver ICs are mounted on the glass substrate. This reference discloses a structure including wire interconnections that a flexible printed circuit is coupled with a common wiring through a connector at an area between two ICs.

U.S. Patent Application Publication No. US2001/0015709 to Imajo et al., the disclosure of which is incorporated herein by reference, describes a mounting scheme in which the driver ICs are directly mounted on the glass substrate of the LCD panel. Various signals including power signals are supplied to the driver ICs terminals of a flexible printed circuit connected at an outer side of the driver ICs. The flexible printed circuit can also include a protruding portion in an area between two driver ICs. The protruding portion can be provided with a chip capacitor connected with terminals of the flexible printed circuit.

Improvements could be made to the aforementioned assembly schemes of driver components. In particular, the conventional interconnection of the flexible printed circuit with the driver ICs is usually achieved via a complex connector structure or via at least two anisotropic conductive layers respectively attaching the ICs and flexible printed circuit on the substrate. None of these techniques is economically desirable.

Therefore, there is a need in the art for a flat display panel implementation and an assembly process that can reduce the manufacture cost and the processing time in the assembly of driver components in the flat display panel.

SUMMARY OF THE INVENTION

The present invention provides an electrical connection structure and an assembly process that can reduce the material cost and processing time in the assembly of driver components in a flat display panel.

According to one aspect of the present invention, a flat display panel comprises a plurality of driver ICs and one or more flexible printed circuits assembled on a substrate, a plurality of common wires formed on the substrate to electrically connect the ICs to the one or more flexible printed circuit, and one anisotropic conductive film that connects the driver ICs and flexible printed circuits to the common wires.

In one embodiment of the present invention, the one or more flexible printed circuit includes an extending portion overlapping with one or more common wire, the second bonding pads being located in an area of the extending portion. In a variant embodiment, the extending portion of the one or more flexible printed circuit is located in an area between two ICs.

According to another aspect of the present invention, an assembly process of driver components in a flat display panel is described. The anisotropic conductive film is formed over a bonding area of the substrate. The driver ICs and the flexible printed circuit are aligned over the substrate relative to the common wires. An extending portion of the flexible printed circuit is aligned to overlap with one or more common wire. The driver ICs and the flexible printed circuit then are pressed against the substrate while the anisotropic conductive film is heated.

In one embodiment of the present invention, the anisotropic conductive film is laminated as a continuous layer connecting the ICs and flexible printed circuit to the flexible printed circuits. In a variant embodiment, the ICs include data driver ICs of a LCD panel. In other variations, the ICs include scan driver ICs of the LCD panel.

The foregoing is a summary and shall not be construed to limit the scope of the claims. The operations and structures disclosed herein may be implemented in a number of ways, and such changes and modifications may be made without departing from this invention and its broader aspects. Other aspects, inventive features, and advantages of the invention, as defined solely by the claims, are described in the non-limiting detailed description set forth below.

DETAILED DESCRIPTION OF THE EMBODIMENT(S)

The present invention describes an electrical connection structure and an assembly process that can reduce the material cost and processing time in the assembly of driver components in a flat display panel. In exemplary implementations, the following description depicts embodiments in which the flat display panel is a LCD panel. However, the structure and assembly process of the invention are intended to be generally suitable with any types of displays such as electroluminescent displays, plasma displays or the like.

Figure 1A:
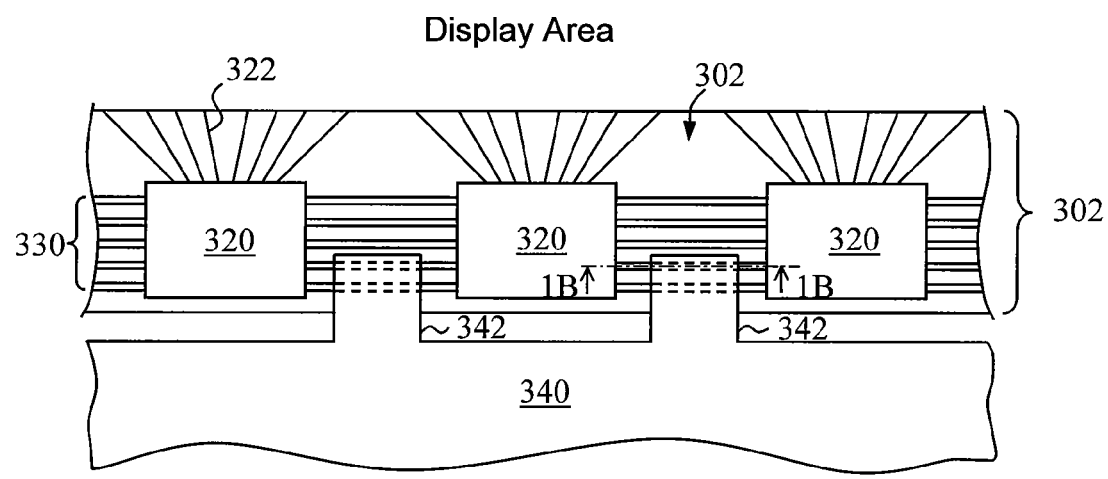
FIG. 1A is a planar view of an connection structure of driver components in a LCD panel according to an embodiment of the invention.

FIG. 1A is a schematic view illustrating the connection scheme of driver components in a LCD panel according to an embodiment of the invention. In a peripheral non-display area 302 of the LCD panel are a plurality of driver ICs 320. The driver ICs 320 couple via wiring lines 322 to pixel elements (not shown) located in the display area. The driver ICs 320 can be scan driver ICs or data driver ICs configured to deliver either addressing or image data signals to the pixels for image display.

As illustrated, common wires 330 are provided to connect the driver ICs 320 to a flexible printed circuit 340. The flexible printed circuit 340 includes at least one extending portion 342 in an area of the LCD panel between two neighboring driver ICs 320. The extending portion 342 overlaps with one or more common wiring lines 330 to which the flexible printed circuit 340 is connected.

Figure 1B:
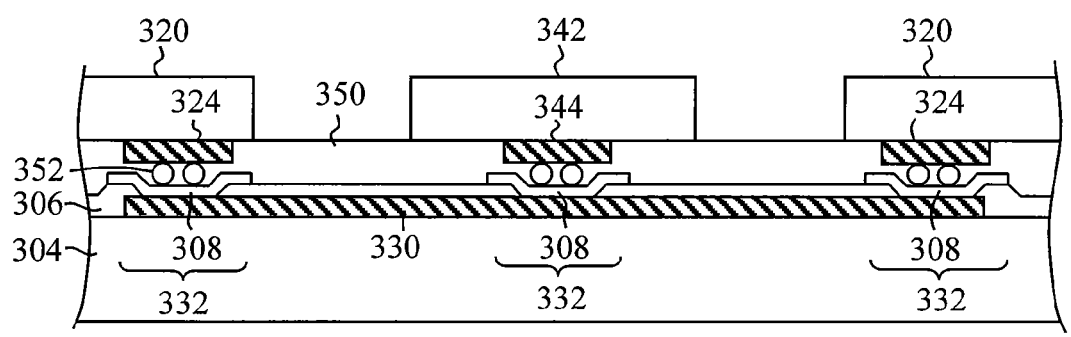
FIG. 1B is a cross-sectional view taken along section 1B in FIG. 1A.

FIG. 1B is a schematic view taken along section 1B-1B in FIG. 1A. The common wires 330 are patterned on a transparent substrate 304 of the LCD panel. A passivation layer 306 made of an insulating material is formed over the substrate 340 and includes openings exposing portions of the common wires 330. Contact layers 308 made of conductive materials are formed through the openings to connect with the common wires 330, thereby forming terminal pads 332 of the common wires 330.

An anisotropic conductive film 350 connects first connecting terminals 324 of the driver ICs 320 and second connecting terminals 344 provided in the extending portion 342 of the flexible printed circuit 340 to the common wires 330. Conductive particles 352 of the anisotropic conductive film 350 form conductive paths that electrically connect the first and second connecting terminals 324, 344 to the terminal pads 332 of the common wires 330.

In one embodiment, the extending portion 342 of the flexible printed circuit 340 can be configured to overlap common wires 330 for delivering power and ground voltages to the driver ICs 320. However, it is understood that the extending portion of the flexible printed circuit can overlap more common wires should more signal connections be needed between the flexible printed circuit and the driver ICs. As electrical signals are delivered from terminals in areas between the driver ICs, shorter signal paths are provided to prevent signal loss and the assembly space required for the flexible printed circuit can be favorably reduced.

Figure 2A:
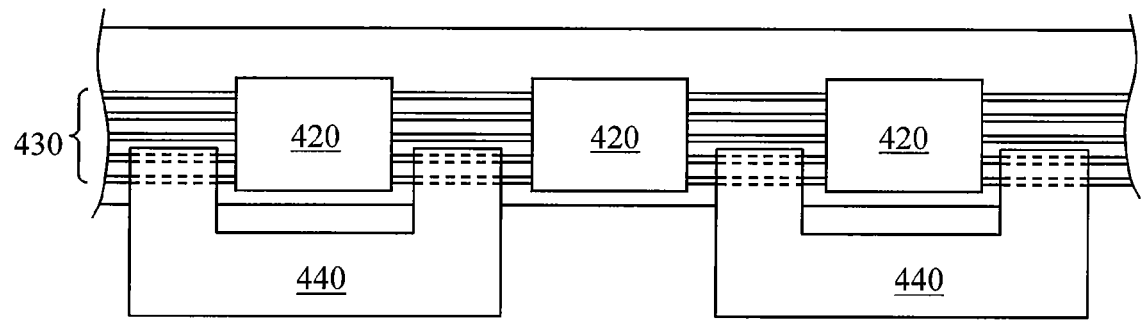
FIG. 2A and 2B are schematic views of modules of flexible printed circuit according to various examples of the invention.
Figure 2B:
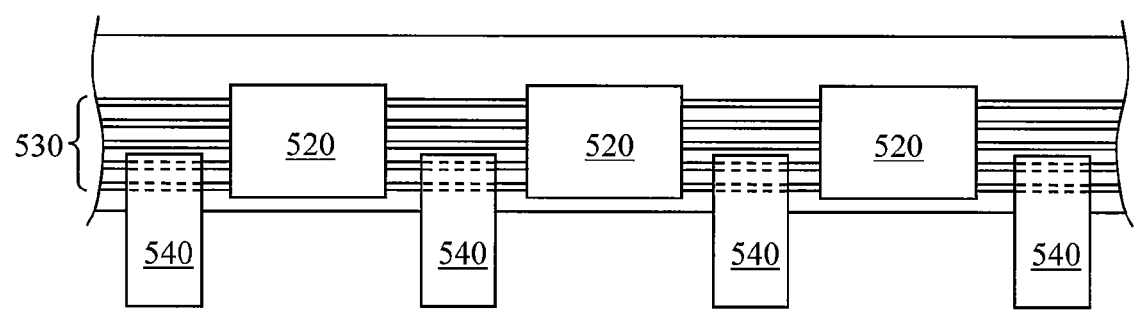

As illustrated in FIG. 2A and 2B, the assembly of the flexible printed circuit in overlap with the common wires can favorably allow its modularization. As shown in FIG. 2A, U-shaped modules 440 of flexible printed circuit can be successively coupled with common wires 430 in areas between the driver ICs 420. In FIG. 2B, flexible printed circuits 540 of generally rectangular shapes can be coupled via the anisotropic conductive film with common wires 530 at spaced intervals along the common wires 530. The modularization of the flexible printed circuit into separate modules can favorably reduce its cost and optimize its occupation space in assembly.

FIG. 3A~3D are schematic views of a process of mounting a flexible printed circuit and driver ICs on a LCD panel according to an embodiment of the invention. For purposes of illustration, in the present example, various steps are described in a particular order. However, when needed for specific configurations, these steps can be performed in orders different from the present embodiment.

Figure 3A:
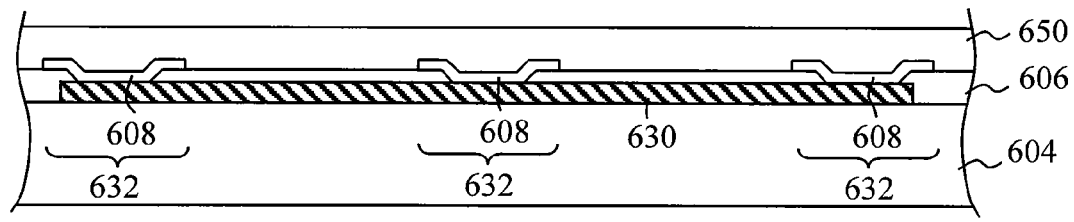
FIG. 3A~3D are schematic views of an assembly process of driver components in the manufacture of a LCD panel according to an embodiment of the invention.

In FIG. 3A, an anisotropic conductive film 650 is laminated over a bonding area of the LCD panel. The bonding area can correspond to a non-display area on a substrate 604 of the LCD panel where a flexible printed circuit and driver ICs are to be mounted. The bonding area covered by the anisotropic conductive film 650 includes terminal pads 632 of common wires 630 patterned on the substrate 604. The terminal pads 632 can be formed by contact layers 608 that connect with portions of the common wires 630 exposed through an insulating layer 606.

Figure 3B:
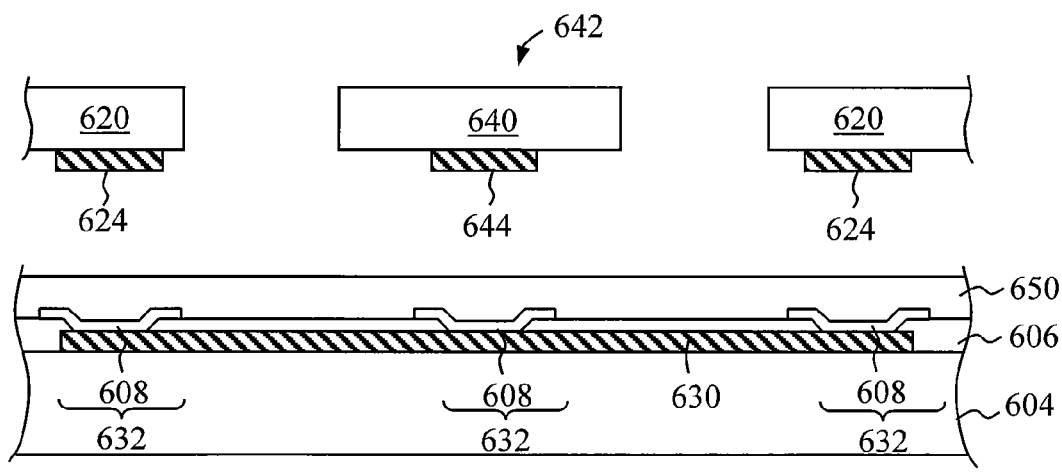
Figure 3C:
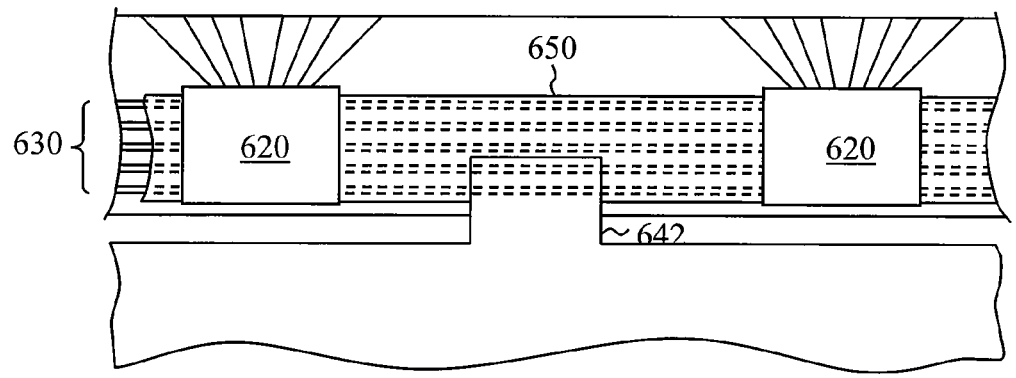

In FIG. 3B, driver ICs 620 and a flexible printed circuit 640 are aligned over the substrate 604 so that their respective connecting terminals 624 and 644 approximately faces the terminal pads 632 of the common wires 630. As shown in the planar view of FIG. 3C, the flexible printed circuit 640 is particularly placed so that an extending portion 642 overlaps with a portion of one or more common wire 630 in an area between two driver ICs 620. The connecting terminals 644 of the flexible printed circuit 640 are located in an area of its extending portion 642.

Figure 3D:
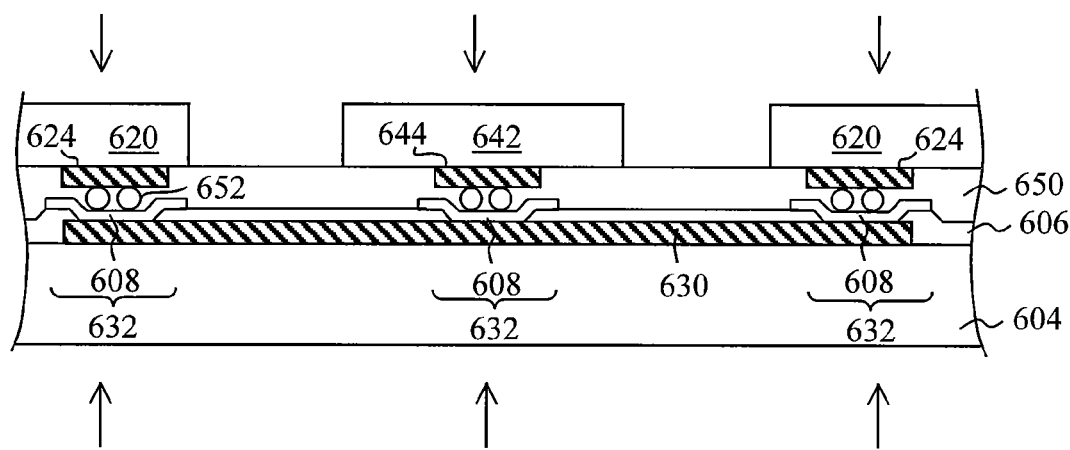

In FIG. 3D, the driver ICs 620 and extending portion 642 of flexible printed circuit 640 are pressed against the substrate 604 while the anisotropic conductive film 650 is heated. The applied pressure can be approximately between 10 to 20 $Kg/cm^2$. If the anisotropic conductive film 650 is made of a thermosetting resin, the heating temperature can be about 180° C. to 190° C. If it is made of a thermoplastic material, the anisotropic conductive film 650 is heated and subsequently cooled to harden. The anisotropic conductive film 650 thereby attaches the driver ICs 620 and flexible printed circuit 640 on the substrate 604, and conductive particles 652 in the anisotropic conductive film 650 form conductive paths that electrically connect the connecting terminals 624, 644 of the driver ICs to the terminal pads 632 of the common wires 630.

The above-described connection scheme can be particularly implemented to assemble driver ICs and flexible printed circuits via a single anisotropic conductive film along one side of the LCD panel. Since a single anisotropic conductive film is used, the driver ICs and the flexible printed circuits can be assembled in the same time. As a result, the material cost and the processing time can be favorably reduced.

Diverse variations of the invention as described above can be implemented. In a variant example, the anisotropic conductive film can include separate portions locally dispensed at the target areas instead of being formed of a continuous layer.

Realizations in accordance with the present invention therefore have been described in the context of particular embodiments. These embodiments are meant to be illustrative and not limiting. Many variations, modifications, additions, and improvements are possible. Accordingly, plural instances may be provided for components described herein as a single instance. Additionally, structures and functionality presented as discrete components in the exemplary configurations may be implemented as a combined structure or component. These and other variations, modifications, additions, and improvements may fall within the scope of the invention as defined in the claims that follow.

What is claimed is:

1. An assembly process for display panel, comprising:
   providing a substrate having at least one common wire;
   forming one anisotropic conductive film covering the at least one common wire;
   aligning at least two integrated circuits spaced apart from each other over the anisotropic conductive film and the at least one common wire;
   aligning a portion of a flexible printed circuit in an area between the at least two integrated circuits so that the portion of the flexible printed circuit overlaps with a portion of the at least one common wire located in the area between the at least two integrated circuits; and pressing the at least two integrated circuits and the portion of the flexible printed circuit against the substrate while heating the anisotropic conductive film to electrically connect the at least two integrated circuits and the portion of the flexible printed circuit to the at least one common wire.

2. The process according to claim 1, wherein the step of forming the anisotropic conductive film includes laminating a single layer of anisotropic conductive material.

3. The process according to claim 1, wherein the step of forming the anisotropic conductive film includes laminating a continuous layer of anisotropic conductive material.

4. The process according to claim 1, wherein the at least two integrated circuits include scan drivers.

5. The process according to claim 1, wherein the at least two integrated circuits include data drivers.

6. The process according to claim 1, wherein the at least one common wire includes a power line.

7. The process according to claim 1, wherein the step of aligning the at least two integrated circuits comprises:

aligning a first connection terminal of a first integrated circuit with a first contact pad on the at least one common wire; and aligning a second connection terminal of a second integrated circuit with a second contact pad on the at least one common wire.

8. The process according to claim 7, wherein the step of aligning the portion of the flexible printed circuit comprises aligning a third connection terminal provided on the portion of the flexible printed circuit with a third contact pad on the at least one common wire, wherein the third contact pad is located between the first and second contact pads.

9. The process according to claim 8, wherein the step of pressing the at least two integrated circuits and the portion of the flexible printed circuit against the substrate while heating the anisotropic conductive film causes the first, second and third connection terminals to electrically connect with the first, second and third contact pads, respectively.

10. The process according to claim 1, wherein the at least two integrated circuits and the portion of the flexible printed circuit are aligned along a same side on a peripheral area of the substrate.

11. An assembly process for a display panel, comprising:

providing a substrate having a common wire in a peripheral area of the substrate;

forming a plurality of spaced-apart contact pads on the common wire, wherein the contact pads comprises a first, second and third contact pad, the third contact pad being located between the first and second contact pads;

forming an anisotropic conductive film covering the contact pads;

aligning a first connection terminal of a first integrated circuit with the first contact pad;

aligning a second connection terminal of a second integrated circuit with the second contact pad;

aligning a third connection terminal provided on a portion of a flexible printed circuit with the third contact pad; and pressing the first and second integrated circuits and the portion of the flexible printed circuit against the substrate while heating the anisotropic conductive film to electrically connect the first, second and third connection terminals with the first, second and third contact pads, respectively.

12. The process according to claim 11, wherein the common wire includes a power line.

13. The process according to claim 11, wherein the first and second integrated circuits include scan driver integrated circuits.

14. The process according to claim 11, wherein the first and second integrated circuits include data driver integrated circuits.

15. The process according to claim 11, wherein the step of aligning a third connection terminal provided on a portion of a flexible printed circuit with the third contact pad comprises placing the portion of the flexible printed circuit between the first and second integrated circuits.

16. The process according to claim 15, wherein the step of placing the portion of the flexible printed circuit between the first and second integrated circuits comprises placing the portion of the flexible printed circuit at a position overlapping with a portion of the common wire located between the first and second integrated circuits.

17. The process according to claim 11, wherein the first and second integrated circuits and the portion of the flexible printed circuit are aligned along a same side on the peripheral area of the substrate.

* * * * *

UNITED STATES PATENT AND TRADEMARK OFFICE
CERTIFICATE OF CORRECTION

| | | |
|---|---|---|
| PATENT NO. | : 7,515,240 B2 | Page 1 of 1 |
| APPLICATION NO. | : 10/958719 | |
| DATED | : April 7, 2009 | |
| INVENTOR(S) | : Chao-Liang Lu et al. | |

It is certified that error appears in the above-identified patent and that said Letters Patent is hereby corrected as shown below:

Title Page, Item (54), and Col. 1, Line 1-3,

Change "FLAT DISPLAY PANEL AND ASSEMBLY PROCESS OR DRIVER COMPONENTS IN FLAT DISPLAY PANEL"

to "FLAT DISPLAY PANEL AND ASSEMBLY PROCESS OF DRIVER COMPONENTS IN FLAT DISPLAY PANEL"

Signed and Sealed this
Nineteenth Day of July, 2011

David J. Kappos
*Director of the United States Patent and Trademark Office*